US011355322B2

(12) United States Patent
Iwase et al.

(10) Patent No.: US 11,355,322 B2
(45) Date of Patent: Jun. 7, 2022

(54) PLASMA PROCESSING APPARATUS AND PLASMA PROCESSING METHOD

(71) Applicant: Hitachi High-Technologies Corporation, Tokyo (JP)

(72) Inventors: Taku Iwase, Tokyo (JP); Masahito Mori, Tokyo (JP); Takao Arase, Tokyo (JP); Kenetsu Yokogawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 111 days.

(21) Appl. No.: 15/425,014

(22) Filed: Feb. 6, 2017

(65) Prior Publication Data
US 2018/0040459 A1 Feb. 8, 2018

(30) Foreign Application Priority Data
Aug. 8, 2016 (JP) .............................. JP2016-155193

(51) Int. Cl.
*H01J 37/32* (2006.01)

(52) U.S. Cl.
CPC ...... *H01J 37/32697* (2013.01); *H01J 37/321* (2013.01); *H01J 37/3211* (2013.01); *H01J 37/32568* (2013.01); *H01J 37/32669* (2013.01); *H01J 37/32724* (2013.01); *H01J 37/32871* (2013.01); H01J 2237/334 (2013.01)

(58) Field of Classification Search
None
See application file for complete search history.

(56) References Cited

U.S. PATENT DOCUMENTS

| 6,652,710 B2 * | 11/2003 | Cruse | .................... B24B 37/013 |
| | | | 156/345.48 |
| 2004/0076762 A1 | 4/2004 | Iijima | |
| 2009/0004871 A1 | 1/2009 | Maeda et al. | |
| 2010/0025372 A1* | 2/2010 | Tsujimoto | ........... H01L 21/6833 |
| | | | 216/71 |

(Continued)

FOREIGN PATENT DOCUMENTS

| JP | 2002-270576 A | 9/2002 |
| JP | 2007-081208 A | 3/2007 |

(Continued)

OTHER PUBLICATIONS

Korean Office Action received in corresponding Korean Application No. 10-2017-0004061 dated Jan. 22, 2018.

(Continued)

*Primary Examiner* — Sylvia Macarthur
(74) *Attorney, Agent, or Firm* — Mattingly & Malur, PC

(57) ABSTRACT

Disclosed herein is a plasma processing apparatus including: a processing chamber in which a sample is to be processed using plasma; a radio-frequency power source that supplies radio-frequency power for producing the plasma; and a sample stage on which the sample is to be mounted, the plasma processing apparatus further including a control unit that performs control so that plasma is produced after applying a DC voltage for electrostatically attracting the sample to the sample stage to each of two electrodes placed on the sample stage, and a heat-transfer gas for adjusting a temperature of the sample is supplied to a back surface of the sample after production of the plasma.

6 Claims, 7 Drawing Sheets

(56) References Cited

U.S. PATENT DOCUMENTS

| | | | |
|---|---|---|---|
| 2012/0067521 A1 | 3/2012 | Shimomura et al. | |
| 2014/0001154 A1 | 1/2014 | Sato et al. | |
| 2015/0194330 A1 | 7/2015 | Sasaki et al. | |
| 2015/0303092 A1* | 10/2015 | Kawabata | H01L 21/6833 361/234 |
| 2016/0027615 A1 | 1/2016 | Ishiguro et al. | |
| 2016/0172161 A1* | 6/2016 | Ikenaga | H01J 37/32577 156/345.28 |
| 2018/0040459 A1* | 2/2018 | Iwase | H01J 37/321 |

FOREIGN PATENT DOCUMENTS

| | | |
|---|---|---|
| JP | 2009-141014 A | 6/2009 |
| JP | 2009-194194 A | 8/2009 |
| JP | 2014-011215 A | 1/2014 |
| KR | 10-1155535 B1 | 6/2012 |
| KR | 10-2015-0053899 A | 5/2015 |
| KR | 10-2016-0012904 A | 2/2016 |

OTHER PUBLICATIONS

Japanese Office Action received in corresponding Japanese Application No. 2016-155193 dated Nov. 5, 2019.

* cited by examiner

PLASMA PROCESSING APPARATUS AND PLASMA PROCESSING METHOD

CLAIM OF PRIORITY

The present application claims priority from Japanese patent application JP 2016-155193 filed on Aug. 8, 2016, the content of which is hereby incorporated by reference into this application.

BACKGROUND OF THE INVENTION

1. Field of the Invention

The present invention relates to a plasma processing apparatus and a plasma processing method, which are suitable for performing processing, such as etching, using plasma.

2. Description of the Related Art

Plasma processing apparatuses are widely used in, for example, a film-forming process or a plasma etching process during production of semiconductor devices. Such plasma processing apparatuses are required to achieve both high-precision processing performance corresponding to device miniaturization and mass productivity. Further, mass production of devices has a major problem of reduction in yields due to foreign particles adhering to a wafer during plasma processing.

When foreign particles adhere to a wafer during plasma processing, a critical defect for a semiconductor device, such as wiring disconnection or short circuit, may occur. Further, the influence of minute foreign particles that have previously caused no problems increases as device miniaturization develops. Such foreign particles can be removed by wet treatment after plasma processing, which is however disadvantageous in that the number of device production processes increases so that device production costs increase. Therefore, what is important are techniques relating to suppression of adhesion of foreign particles to a wafer during plasma processing, such as a technique for suppressing the generation itself of foreign particles, a technique for removing generated foreign particles, and a technique for preventing falling of foreign particles on a wafer.

For example, JP-2002-270576-A discloses a plasma processing method for preventing adhesion of foreign particles caused by electrostatic chuck of a wafer, in which when an end-point detector (EPD) detects an end point, RF power (Bottom RF) from a radio-frequency power source 12 is turned off, the supply of He gas 14 to the back surface of a wafer W is stopped, and a high-voltage DC power source 13 (HV) is turned off under conditions where RF power (Top RF) from a radio-frequency power source 11 is controlled to be within a range where etching does not progress and plasma discharge can be maintained.

Further, JP-2009-141014-A discloses a plasma processing apparatus including: a vacuum processing chamber 115; a sample stage 101 placed in the vacuum processing chamber; and an antenna electrode 105 to which radio-frequency power is supplied to produce plasma in the vacuum processing chamber, wherein a sample placed on the sample stage is subjected to plasma processing using the produced plasma, the sample stage 101 includes an insulated electrode for electrostatic chuck provided on its sample mounting surface, and the electrode for electrostatic chuck is charged to improve plasma ignition by supplying a predetermined DC voltage in a predetermined time period before plasma is produced by supplying radio-frequency power to the antenna electrode.

Further, JP-2014-11215-A discloses a plasma processing apparatus including: a processing chamber provided inside a vacuum container and having an inner space for forming plasma under a reduced pressure; a sample stage placed in a lower part of the processing chamber and having an upper surface on which a sample to be processed using the plasma is to be mounted; a dielectric film made of a dielectric material and constituting a mounting surface on which the sample on the sample stage is to be mounted; and two or more electrodes placed inside the dielectric film so that electric power for attracting and holding the sample to the dielectric film is supplied to the electrodes, wherein electric power is supplied to at least one of the electrodes in a state where the sample is mounted on the sample stage to chuck part of the sample and heat the sample to a predetermined temperature, and then electric power is supplied to the other electrode(s) to chuck a large area of the sample, and then processing of the sample is started using the plasma. Further, JP-2007-81208-A discloses a plasma processing method in which foreign particles are captured by controlling plasma to have an out-high distribution.

SUMMARY OF THE INVENTION

Foreign particles adhere to the outer peripheral edge of a wafer through various production processes. Therefore, when such a wafer is brought into a plasma processing apparatus, there is a problem that foreign particles adhering to the wafer scatter and then adhere to the surface of the wafer.

The present inventors have intensively studied to solve such a problem that foreign particles adhering to the outer edge and back surface of a wafer scatter, and as a result have found that foreign particles adhere to the surface of a wafer at the timing when a sudden temperature change of the wafer is caused in the initial stage of wafer processing. From the result, it has been found that it is necessary for suppression of adhesion of initial foreign particles to suppress a sudden temperature change of a wafer.

However, JP-2002-270576-A and JP-2014-11215-A do not give sufficient attention to foreign particles generated during plasma discharge, and therefore do not make it possible to sufficiently reduce foreign particles. Further, JP-2007-81208-A does not clearly describe the timing of actual scattering of foreign particles and does not sufficiently study a processing sequence, and therefore does not make it possible to sufficiently effectively reduce foreign particles. Further, JP-2002-270576-A and JP-2007-81208-A do not describe nor suggest the above-described point "suppression of a sudden temperature change of a wafer is important for suppression of adhesion of initial foreign particles".

Under the above circumstances, the present invention provides a plasma processing apparatus and a plasma processing method which are capable of suppressing adhesion of initial foreign particles, adhering to the outer peripheral edge of a wafer, to the surface of the wafer.

The present invention is directed to a plasma processing apparatus including: a processing chamber in which a sample is to be processed using plasma; a radio-frequency power source that supplies radio-frequency power for producing the plasma; and a sample stage on which the sample is to be mounted, the plasma processing apparatus further including a control unit that performs control so that plasma is produced after applying a DC voltage for electrostatically attracting the sample to the sample stage to each of two electrodes placed on the sample stage, and a heat-transfer gas for adjusting a temperature of the sample is supplied to a back surface of the sample after production of the plasma.

Further, the present invention is also directed to a plasma processing method for processing a sample with use of plasma, including: producing plasma after applying a DC voltage for electrostatically attracting the sample to each of two electrodes placed on a sample stage on which the sample is to be mounted; and supplying a heat-transfer gas for adjusting a temperature of the sample to a back surface of the sample after production of the plasma.

According to the present invention, it is possible to suppress adhesion of initial foreign particles, adhering to the outer peripheral edge of a wafer, to the surface of the wafer.

DESCRIPTION OF THE PREFERRED EMBODIMENTS

As described above, it is important for suppression of adhesion of initial foreign particles to suppress a sudden temperature change of a wafer. A sudden temperature change of a wafer occurs at the timing when the wafer is electrostatically attracted to a sample stage, the timing when plasma discharge is started, and the timing when a heat-transfer gas is supplied to the back surface of the wafer. Therefore, in order to prevent a sudden temperature change of a wafer, the timing when the wafer is electrostatically attracted to a sample stage, the timing when plasma discharge is started, and the timing when a heat-transfer gas is supplied to the back surface of the wafer need to have such a correlation as shown in FIG. 1 with one another.

Figure 1:
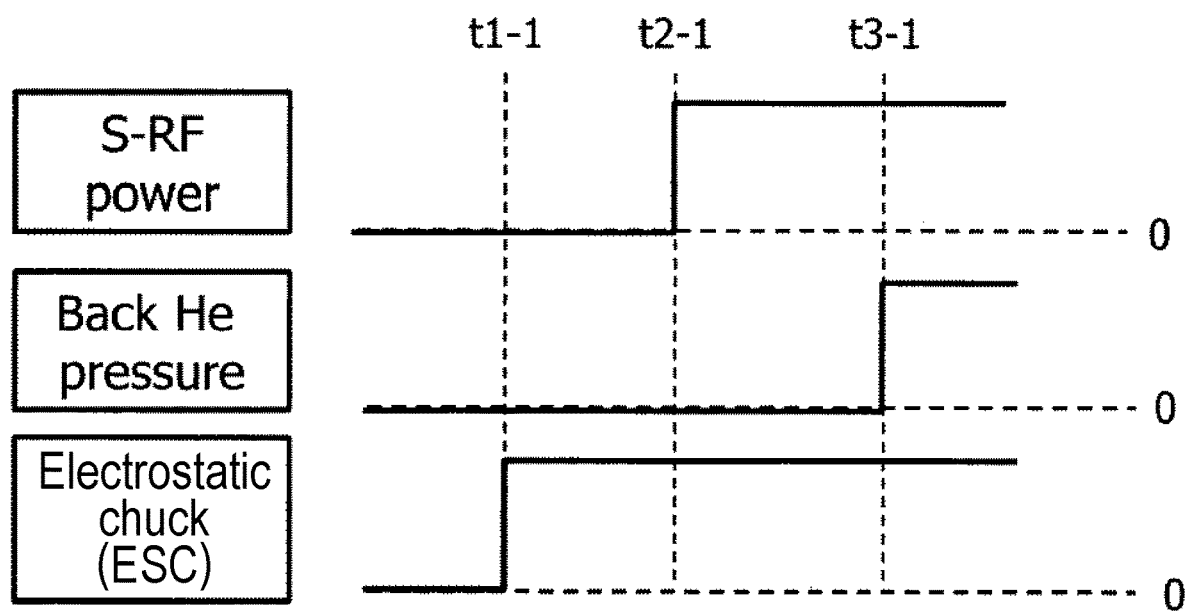
FIG. 1 is a diagram illustrating a plasma processing sequence according to the present invention.

Therefore, in the present invention, a correlation among the timing when a wafer is electrostatically attracted to a sample stage, the timing when plasma discharge is started, and the timing when a heat-transfer gas is supplied to a back surface of the wafer is defined as shown in FIG. 1. That is, the technical scope of the present invention is as follows: "plasma is produced after applying a DC voltage for electrostatically attracting a wafer to a sample stage to each of two electrodes placed on the sample stage, and then a heat-transfer gas for adjusting a temperature of the wafer is supplied to the back surface of the wafer after production of the plasma". It is to be noted that "t1-1" shown in FIG. 1 refers to the timing when a wafer is electrostatically attracted to a sample stage, "t2-1" shown in FIG. 1 refers to the timing when plasma discharge is started, and "t3-1" shown in FIG. 1 refers to the timing when a heat-transfer gas is supplied to the back surface of the wafer. Hereinbelow, specific embodiments of the present invention will be described.

Figure 2:
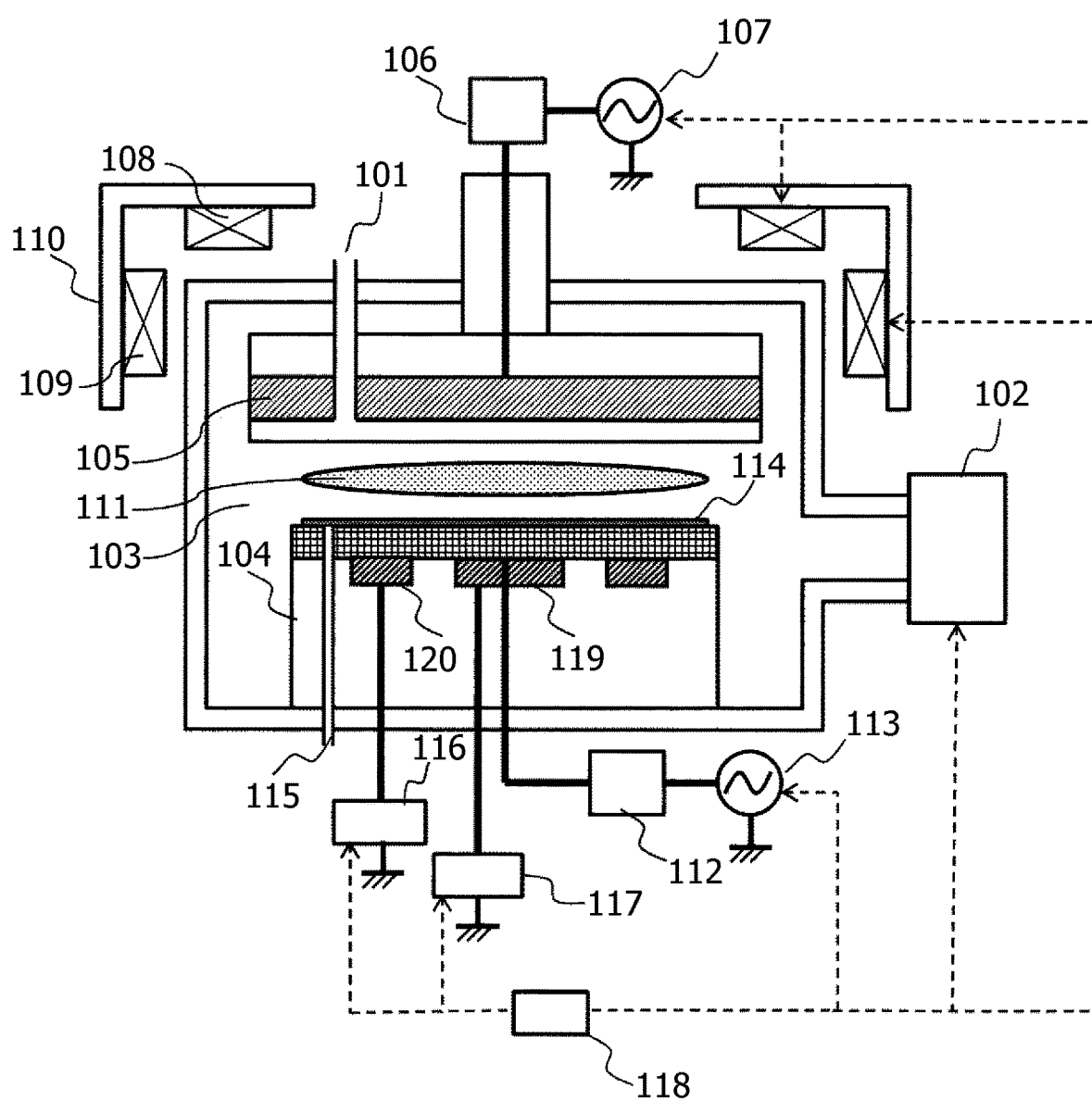
FIG. 2 is a schematic sectional view of a plasma processing apparatus according to the present invention.

First, a plasma processing apparatus for carrying out the present invention will be described. FIG. 2 is a schematic sectional view illustrating the structure of a plasma processing apparatus according to an embodiment of the present invention. The plasma processing apparatus used in this embodiment includes a vacuum processing chamber 103 having a process gas inlet 101 and an exhaust port 102, and a stage 104 provided as a sample stage in the vacuum processing chamber 103. Further, the plasma processing apparatus according to the present invention includes an antenna 105 for plasma discharge provided so as to be opposed to the stage 104, a first matching box 106, and a first radio-frequency power source 107 so that a radio-frequency power of 200 MHz is supplied from the first radio-frequency power source 107 to the antenna 105 through the first matching box 106.

In this embodiment, the frequency of the first radio-frequency power source 107 is set to 200 MHz. In the present invention, however, the frequency of the first radio-frequency power source 107 may be set to be in the range of 50 MHz to 2.45 GHz. The use of such a frequency band makes it possible to produce, over a wafer, plasma excellent in uniformity with high efficiency within a pressure range of about 0.2 to 50 Pa suitable for microfabrication processing.

Further, the plasma processing apparatus according to the present invention is configured to produce plasma 111 by the interaction between electromagnetic waves radiated from the antenna 105 and a magnetic field formed by a first external coil 108, a second external coil 109, and a yoke 110 so that plasma processing is performed by applying a radio-frequency bias to a wafer 114 as a sample by supplying a radio-frequency power of 4 MHz from a second radio-frequency power source 113 through a second matching box 112 connected to the stage 104.

In this embodiment, the frequency of the second radio-frequency power source 113 is set to 4 MHz. In the present invention, however, the frequency of the second radio-frequency power source 113 may be set to be in the range of 100 kHz to 20 MHz. The use of such a high frequency band makes it possible to efficiently draw ions to the wafer independently of plasma produced by radio-frequency power supplied from the first radio-frequency power source 107.

Further, the plasma processing apparatus according to the present invention is configured so that the wafer 114 can be electrostatically attracted to the stage 104 by applying a DC voltage from a first DC power source 116 and a DC voltage from a second DC power source 117 to an outer electrode 120 for electrostatic chuck and an inner electrode 119 for electrostatic chuck provided on the stage 104, respectively and that the wafer 114 can be maintained at almost the same temperature as the stage 104 by introducing a heat-transfer gas between the back surface of the wafer 114 and the stage 104 through a heat-transfer gas introduction means 115. Here, as shown in FIG. 2, the first DC power source 116 and the second DC power source 117 are connected to the outer electrode 120 for electrostatic chuck and the inner electrode 119 for electrostatic chuck, respectively. In the present invention, however, the first DC power source 116 and the second DC power source 117 may be connected to the inner electrode 119 for electrostatic chuck and the outer electrode 120 for electrostatic chuck, respectively.

By flowing a predetermined electric current to each of the first external coil 108 and the second external coil 109 providing two lines, a static magnetic field is formed in the vacuum processing chamber 103 by the first external coil 108, the second external coil 109, and the yoke 110. The interaction between this magnetic field and electromagnetic waves radiated from the antenna 105 makes it possible to produce high-density plasma. In other words, the magnetic field vector is changed by changing the value of the electric current flowing through the first external coil 108 and the value of the electric current flowing through the second external coil 109, which makes it possible to control a plasma density distribution.

Plasma processing is performed by allowing a control unit 118 to control actuators such as the above-described first radio-frequency power source 107, second radio-frequency power source 113, first external coil 108, and second external coil 109.

Figure 3:
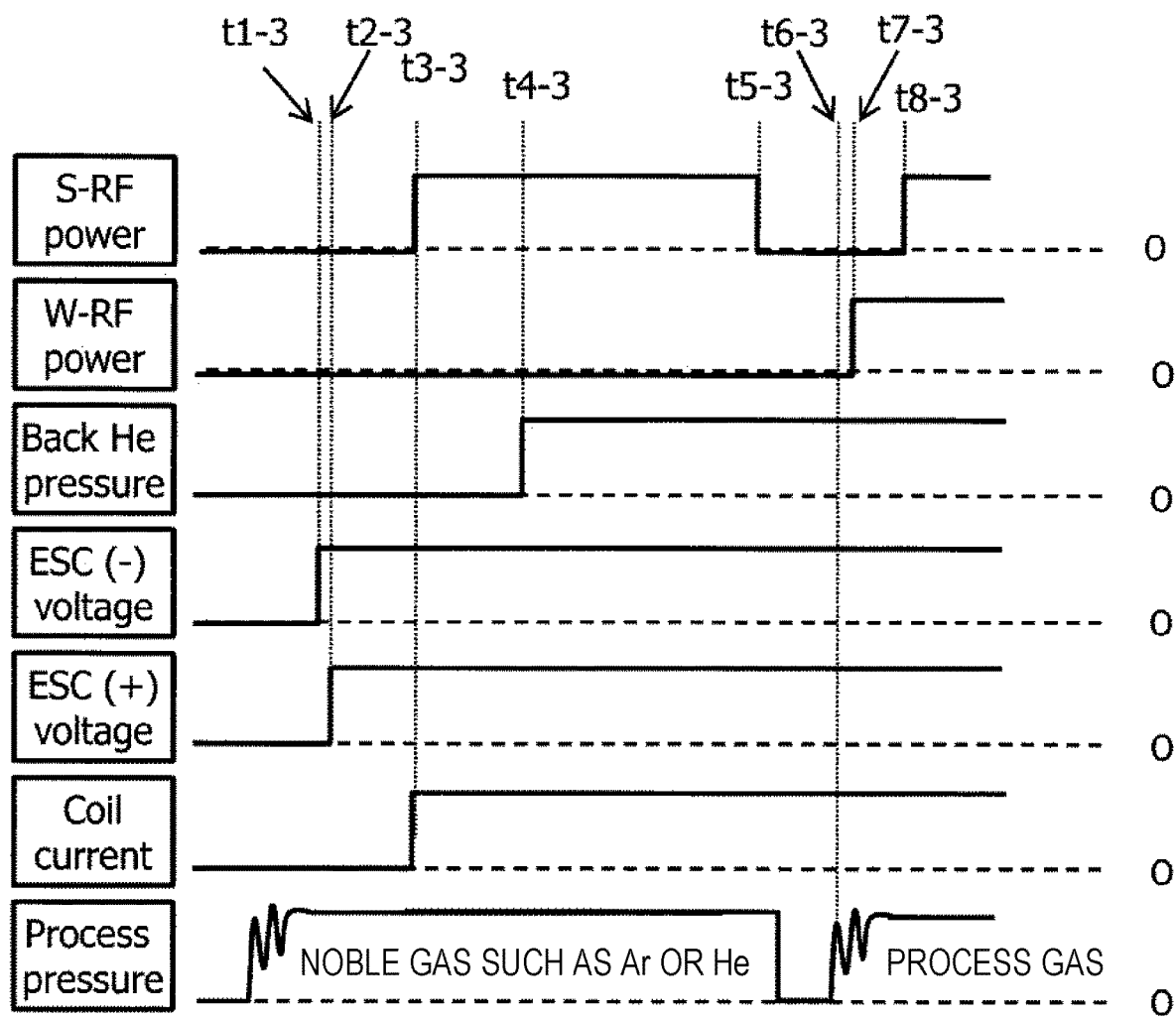
FIG. 3 is a diagram illustrating a plasma processing sequence according to a first embodiment of the present invention.

Hereinbelow, the present invention using the above-described plasma processing apparatus will be specifically described with reference to FIG. 3. FIG. 3 is a diagram illustrating a plasma processing sequence according to the present invention. In FIG. 3, "S-RF power" refers to the radio-frequency power of the first radio-frequency power source 107, "W-RF power" refers to the radio-frequency power of the second radio-frequency power source 113, "Back He pressure" refers to the pressure of a heat-transfer gas supplied between the wafer 114 and the stage 104 from the heat-transfer gas inlet 115, "ESC(−) voltage" refers to a negative voltage applied from the first DC power source 116, "ESC(+) voltage" refers to a positive voltage applied from the second DC power source 117, "Coil current" refers to the current value of the first external coil 108 and the second external coil 109, and "Process pressure" refers to the pressure inside the vacuum processing chamber 103.

In this embodiment, before the timing t1-3 when plasma processing is performed, the wafer 114 is first introduced into the vacuum processing chamber 103 as a processing chamber and mounted on the stage 104, and Ar gas is supplied into the vacuum processing chamber 103 to adjust the pressure inside the vacuum processing chamber 103 to a predetermined pressure. It is to be noted that, in this embodiment, the pressure is adjusted to 4 Pa.

Then, the first DC power source 116 applies a negative voltage of −1600 V to the stage 104 at a timing of t1-3, and then the second DC power source 117 applies a positive voltage of +1200 V to the stage 104 at a timing of t2-3 to electrostatically attract the wafer 114 to the stage 104. At this time, the negative voltage and the positive voltage for electrostatic chuck are set so that their average voltage value is negative. In general, foreign particles are likely to be negatively charged. Therefore, adhesion of foreign particles to the wafer can be significantly suppressed by applying a negative voltage to the stage 104 before the application of a positive voltage to allow the wafer 114 to have a negative electric potential and by maintaining the wafer at a negative electric potential even after the application of a positive voltage to the stage 104. It is to be noted that the average of the negative voltage and the positive voltage for electrostatic chuck is preferably in the range of −500 V to −1 V from the viewpoint of achieving both electrostatic chuck force and reduction in foreign particles.

Then, the first radio-frequency power source 107 supplies a radio-frequency power of 500 W at a timing of t3-3, and an electric current of 2 A and an electric current of 1 A are flowed through the first external coil 108 and the second external coil 109, respectively to produce plasma 111 in the vacuum processing chamber 103. By allowing the wafer 114 to have a negative electric potential in such a manner as described above before plasma production, adhesion of foreign particles to the surface of the wafer just after plasma production can be significantly suppressed.

Then, He gas as a heat-transfer gas at 1 kPa is supplied between the back surface of the wafer 114 and the stage 104 at a timing of t4-3 until a predetermined pressure is reached. By producing stable plasma before supply of He gas in such a manner as described above, foreign particles scattered from the outer periphery of the wafer during supply of He gas are captured in the plasma so that adhesion of foreign particles to the surface of the wafer can be significantly suppressed. Further, the pressure of the heat-transfer gas is preferably 1 kPa or less from the viewpoint of achieving both electrostatic chuck force and temperature conductivity.

Then, radio-frequency power supplied from the first radio-frequency power source 107 is changed to 0 W at a timing of t5-3 to stop plasma discharge. Then, the supply of Ar gas for plasma production into the vacuum processing chamber 103 is also stopped to reduce the pressure inside the vacuum processing chamber 103. In this embodiment, Ar gas is used as a gas for plasma production. In the present invention, however, an inert gas such as He gas, $N_2$ gas, Ne gas, Xe gas, or Kr gas may be used.

Then, $Cl_2$ gas is supplied as a process gas into the vacuum processing chamber 103 at a timing of t6-3 to adjust the pressure inside the vacuum processing chamber 103 to a predetermined pressure (e.g., 6 Pa). Then, the second radio-frequency power source 113 supplies a radio-frequency power of 1000 W to the stage 104 at a timing of t7-3 to apply a wafer bias. Then, the first radio-frequency power source 107 supplies radio-frequency power to the antenna 105 at a timing of t8-3 to produce plasma 111 by the interaction between electromagnetic waves radiated from the antenna 105 and a magnetic field formed by the first external coil 108, the second external coil 109, and the yoke 110 so that plasma processing, such as plasma etching, is performed on the wafer electrostatically attracted to the stage 104.

Figure 5:
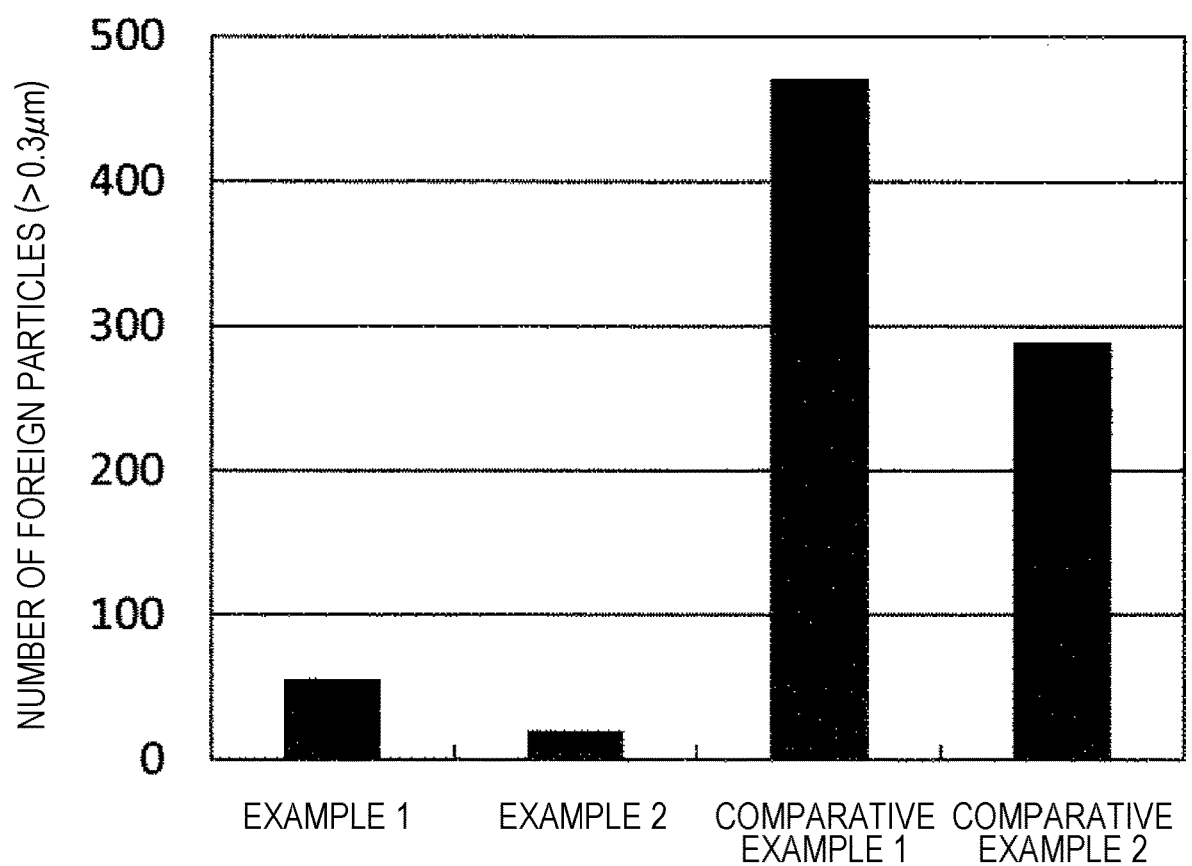
FIG. 5 is a diagram showing the results of measuring the number of foreign particles.

The above-described plasma processing sequence is one example (Example 1) of the plasma processing sequence according to the present invention. By carrying out such a plasma processing sequence (Example 1), as shown in FIG. 5, the number of foreign particles could be significantly reduced as compared to conventional plasma processing sequences of Comparative Examples 1 and 2. It is to be noted that FIG. 5 shows the results of measuring the number of foreign particles having a size of 0.3 μm or more in each of the plasma processing sequences. Comparative Examples 1 and 2 correspond to plasma processing sequences shown in FIGS. 6 and 7, respectively. Each of these plasma processing sequences will be described later.

Hereinbelow, a plasma processing sequence (Example 2) will be described with reference to FIG. 4, which is different from the above-described plasma processing sequence according to the present invention in that the density distribution of produced plasma is changed in a period between t3-3 and t5-3. It is to be noted that the behavior of each parameter in a period before t3-4 and a period after t5-4 in FIG. 4 is the same as that in a period before t3-3 and a period after t5-3 in the above-described plasma processing sequence according to the present invention (FIG. 3), and therefore the description thereof will not be repeated.

Figure 4:
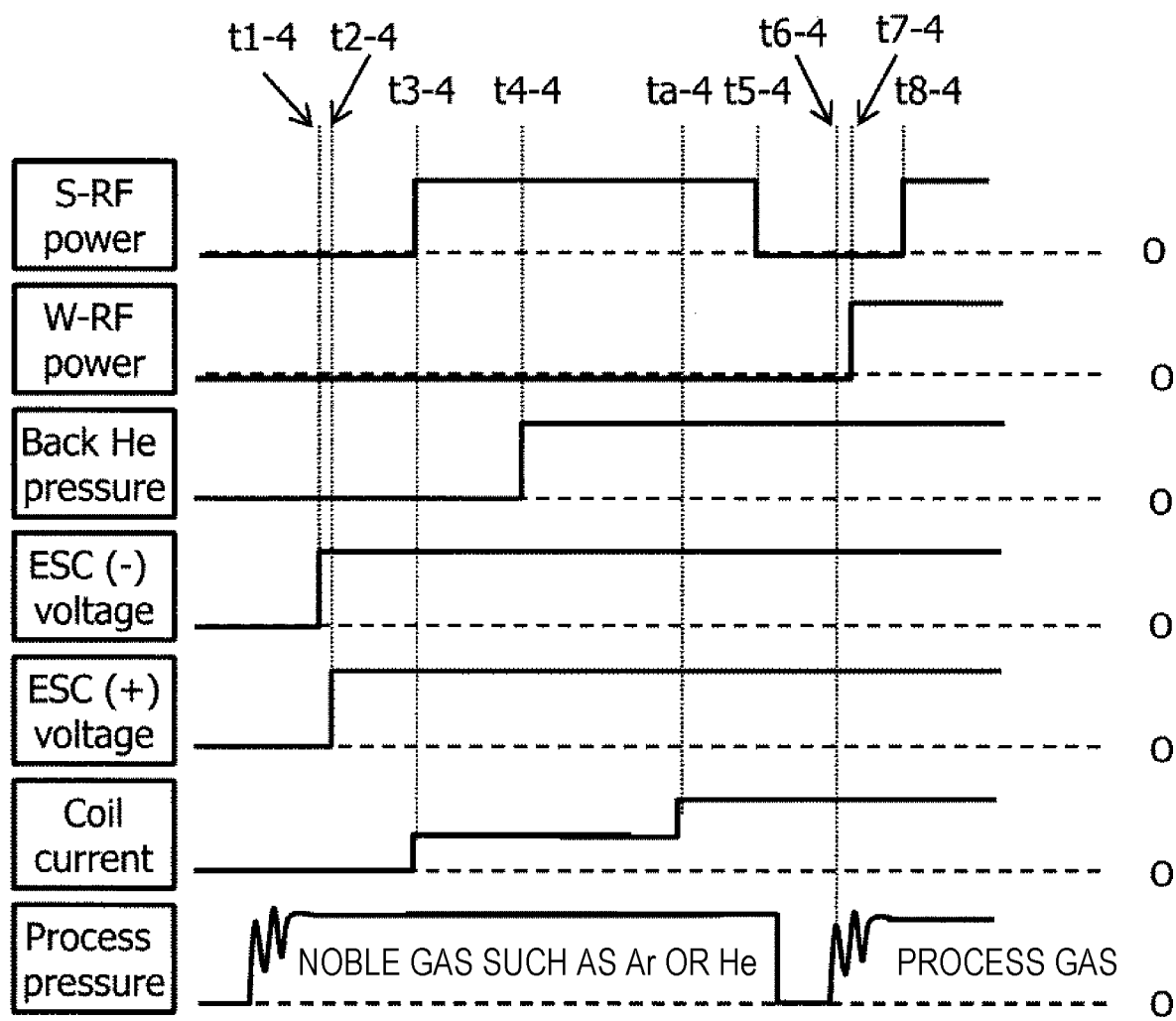
FIG. 4 is a diagram illustrating a plasma processing sequence according to a second embodiment of the present invention.

As shown in FIG. 4, the current value of the first external coil 108 at a timing of t3-4 is 2 A, but is changed to 1 A at a timing of ta-4 between t4-4 and t5-4. The current value of the second external coil 109 at a timing of t3-4 is 1 A, but is also changed to 9 A at a timing of ta−4. By changing the current value of each of the first external coil 108 and the second external coil 109 in such a manner as described above, it is possible to change a plasma density distribution in which the density of plasma is higher in the central portion than in the outer periphery of the wafer to a plasma density distribution in which the density of plasma is higher in the outer periphery than in the central portion of the wafer.

As shown in FIG. 5, the plasma processing sequence shown in FIG. 4 in which the density distribution of produced plasma is changed in a period between t4-4 and t5-4 makes it possible to further reduce foreign particles as compared to the plasma processing sequence shown in FIG. 3. The reason for this is considered to be that foreign particles captured in plasma are moved to the outside of the wafer due to a change in a plasma density distribution caused by a change in each of the current values of the first external coil 108 and the second external coil 109 before disappearance of plasma.

Figure 6:
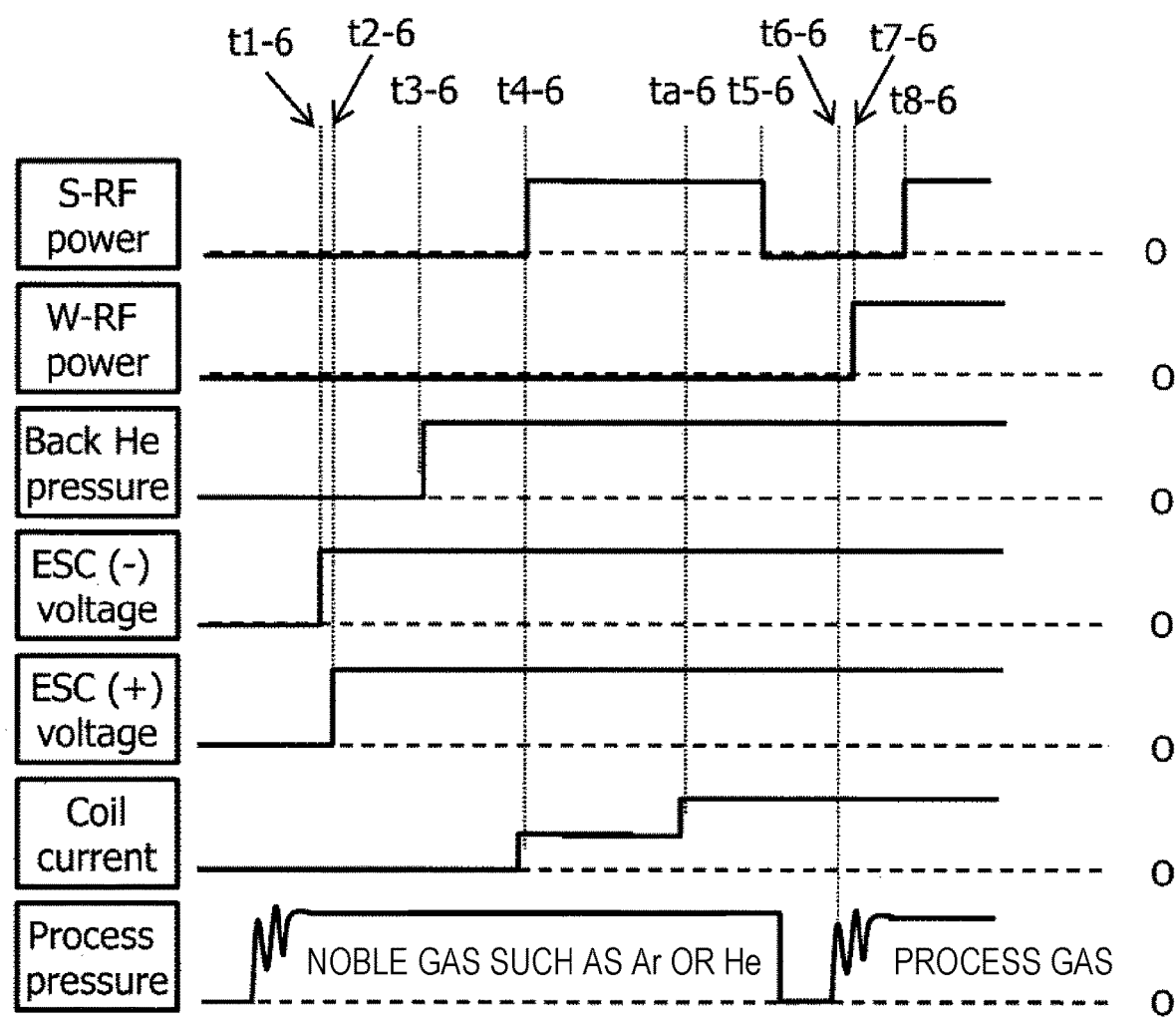
FIG. 6 is a diagram illustrating a plasma processing sequence according to Comparative Example 1.

Hereinbelow, the plasma processing sequences of Comparative Examples 1 and 2 will be described. The plasma processing sequence of Comparative Example 1 is the same as a processing sequence shown in FIG. 3 of JP 2009-141014-A. As shown in FIG. 6, the plasma processing sequence of Comparative Example 1 is different from the plasma processing sequence of Example 2 in that the timing of supply of a heat-transfer gas is before the timing of plasma production using Ar gas.

Figure 7:
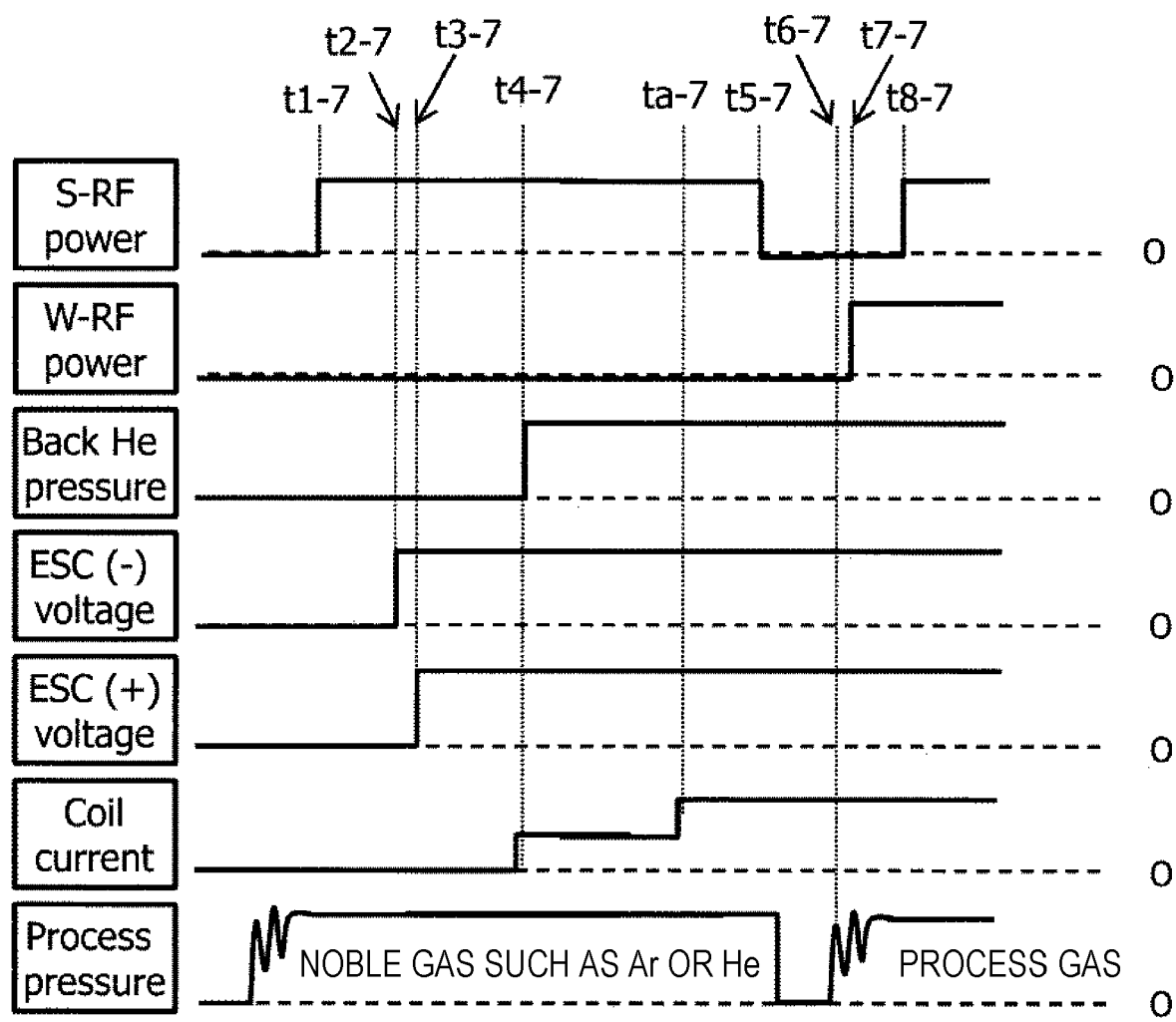
FIG. 7 is a diagram illustrating a plasma processing sequence according to Comparative Example 2.

The plasma processing sequence of Comparative Example 2 is the same as a timing chart shown in FIG. 5 of JP-2014-11215-A. As shown in FIG. 7, in the plasma processing sequence of Comparative Example 2, plasma is produced using Ar gas at a timing of t1-7, a negative voltage for electrostatic chuck is applied to the stage 104 at a timing of t2-7, a positive voltage for electrostatic chuck is applied to the stage 104 at a timing of t3-7, a heat-transfer gas is supplied and a magnetic field is formed in the vacuum processing chamber at a timing of t4-7, and a period after ta-7 is the same as that after t1-4 in the plasma processing sequence of Example 2.

According to the present invention, plasma processing is performed by allowing the control unit 118 to control the first radio-frequency power source, the second radio-frequency power source, the first DC power source, the second DC power source, the first external coil, the second external coil, and the heat-transfer gas inlet based on the plasma processing sequence described with reference to Example 1 or 2.

According to the present invention, a negative voltage is applied to the stage 104 before the application of a positive voltage to allow the wafer 114 to have a negative electric potential, and the wafer is maintained at a negative electric potential even after the application of a positive voltage to the stage 104, which makes it possible to significantly suppress adhesion of foreign particles to the wafer. Further, the wafer is allowed to have a negative electric potential before plasma production, which makes it possible to suppress adhesion of foreign particles scattered during plasma production. Further, a heat-transfer gas is supplied to the back surface of the wafer after plasma production, which makes it possible to allow plasma to capture foreign particles scattered by the heat-transfer gas to prevent the foreign particles from adhering to the wafer. As the synergy of these effects of the present invention, it is possible to prevent adhesion of foreign particles to the surface of the water and improve yields of device production.

The above-described effects of the present invention can be obtained as a result of suppression of a sudden temperature change of a wafer. The point that "a DC high voltage for electrostatic chuck is applied to an electrostatic chuck before plasma production" of a sequence disclosed in FIG. 2(b) of JP-2002-270576-A is the same as part of the present invention, but the effects of the present invention cannot be obtained and the present invention cannot be completed simply by satisfying this point. That is, the point that "a DC high voltage for electrostatic chuck is applied to an electrostatic chuck before plasma production" alone is not sufficient to complete the present invention. This has been demonstrated by comparison between Example 1 and Comparative Example 1 or comparison between Example 2 and Comparative Example 1 as shown in FIG. 5.

Therefore, the present invention is completed by defining a correlation among the timing when a wafer is electrostatically attracted to a sample stage, the timing when plasma discharge is started, and the timing when a heat-transfer gas is supplied to the back surface of the wafer as shown in FIG. 1 so that a sudden temperature change of the wafer can be suppressed.

What is claimed is:

1. A plasma processing apparatus comprising:
a processing chamber in which a sample is to be processed using plasma;
a radio-frequency power source that supplies radio-frequency power for generating the plasma;
a sample stage on which the sample is to be mounted, the sample stage including a heat-transfer gas supply line and;
a first electrode disposed inside the sample stage and a second electrode disposed inside the sample stage;
a first DC power source which applies a DC voltage to the first electrode and a second DC power source which applies a DC voltage to the second electrode; and
a controller configured to control the first DC power source to apply a negative DC voltage to the first electrode at a first timing, then control the second DC power source to initiate application of a positive DC voltage to the second electrode at a second timing, which is after the first timing, then, after applying the positive DC voltage to the second electrode, control the radio-frequency power source to generate the plasma inside the processing chamber at a third timing, which is after the second timing, and then control a supply of a heat-transfer gas for adjusting a temperature of the sample to a back surface of the sample through the heat-transfer gas supply line at a fourth timing, which is after the third timing,
wherein the controller is further configured to control the radio-frequency power source to generate the plasma inside the processing chamber at the third timing while controlling the DC power source to apply the negative DC voltage and the positive DC voltage so that an average of an electric potential given by the negative DC voltage and an electric potential given by the positive DC voltage is maintained at a negative value after applying the positive DC voltage.

2. The plasma processing apparatus according to claim 1, wherein the controller is further configured to control the DC power source applying the negative DC voltage and the positive DC voltage so that the average of the electric potentials is in a range of −500 V to −1 V.

3. The plasma processing apparatus according to claim 1, wherein the controller is further configured to control the supply of the heat-transfer gas so that a pressure of the heat-transfer gas is 1 kPa or less.

4. A plasma processing apparatus comprising:
a processing chamber in which a sample is to be processed using plasma;
a radio-frequency power source that supplies radio-frequency power for generating the plasma;
a sample stage on which the sample is to be mounted;
a first electrode disposed inside the sample stage and a second electrode disposed inside the sample stage;
a first DC power source which applies a DC voltage to the first electrode and a second DC power source which applies a DC voltage to the second electrode; and
a controller configured to control the first DC power source to apply a negative DC voltage to the first electrode at a first timing, then control the second DC power source to initiate application of a positive DC voltage to the second electrode at a second timing, which is after the first timing, then, after applying the positive DC voltage to the second electrode, control the radio-frequency power source to generate the plasma inside the processing chamber at a third timing, which is after the second timing, and then, control a supply of a heat-transfer gas for adjusting a temperature of the sample to a back surface of the sample at a fourth timing, which is after the fifth timing, and then turn off the radio-frequency power source at a fifth timing, which is after the fourth timing,
wherein the controller is further configured to control the supply of the heat-transfer gas for adjusting the temperature of the sample to the back surface of the sample at the fourth timing, while controlling the radio-frequency power source to change the plasma, generated after the third timing, from a plasma having a central plasma density higher than an edge plasma density to a plasma having a central plasma density lower than an edge plasma density after the fourth timing, and then to stop the supply of the radio-frequency power for generating the plasma having the central plasma density lower than the edge plasma density.

5. A plasma processing apparatus comprising:
a processing chamber in which a sample is to be processed using plasma;
a radio-frequency power source that supplies radio-frequency power for generating the plasma;
a sample stage on which the sample is to be mounted;
a first electrode disposed inside the sample stage and a second electrode disposed inside the sample stage;
a first DC power source which applies a DC voltage to the first electrode and a second DC power source which applies a DC voltage to the second electrode; and
a controller configured to control the first DC power source to apply a negative DC voltage to the first electrode at a first timing, then control the second DC power source to initiate application of a positive DC voltage to the second electrode at a second timing, which is after the first timing, then, after applying the positive DC voltage to the second electrode, control the radio-frequency power source to generate the plasma inside the processing chamber at a third timing, which is after the second timing, and then control a supply of a heat-transfer gas for adjusting a temperature of the sample to a back surface of the sample at a fourth timing, which is after the third timing,
wherein the controller is further configured to control the radio-frequency power source to generate the plasma inside the processing chamber at the third timing while controlling the DC power source to apply the negative DC voltage and the positive DC voltage so that an average of an electric potential given by the negative DC voltage and an electric potential given by the positive DC voltage is maintained at a negative value after applying the positive DC voltage.

6. A plasma processing apparatus comprising:
a processing chamber in which a sample is to be processed using plasma;
a first radio-frequency power source that supplies a radio-frequency power for generating the plasma;
a sample stage on which the sample is to be mounted;
a first electrode disposed inside the sample stage and a second electrode disposed inside the sample stage;
a first DC power source which applies a DC voltage to the first electrode and a second DC power source which applies a DC voltage to the second electrode;
a second radio-frequency power source which applies a radio frequency voltage to the sample stage; and
a controller configured to control the first DC power source to apply a negative DC voltage to the first electrode at a first timing, then control the second DC power source to initiate application of a positive DC voltage to the second electrode at a second timing, which is after the first timing, then, after applying the positive DC voltage to the second electrode, control the first radio-frequency power source to generate the plasma inside the processing chamber at a third timing, which is after the second timing, then control a supply of a heat-transfer gas for adjusting a temperature of the sample to a back surface of the sample at a fourth timing, which is after the third timing, then turn off the first radio-frequency power source at a fifth timing, then control the second radio frequency power source to apply a radio frequency voltage to the sample stage at a sixth timing, and then control the first radio-frequency power source to generate the plasma inside the processing chamber at a seventh timing,
wherein the controller is further configured to control the first radio-frequency power source to generate the plasma inside the processing chamber at the third timing while controlling the DC power source to apply the negative DC voltage and the positive DC voltage so that an average of an electric potential given by the negative DC voltage and an electric potential given by the positive DC voltage is maintained at a negative value after applying the positive DC voltage.

* * * * *